United States Patent
La Fetra

(10) Patent No.: US 7,076,686 B2
(45) Date of Patent: Jul. 11, 2006

(54) HOT SWAPPING MEMORY METHOD AND SYSTEM

(75) Inventor: Ross V. La Fetra, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 515 days.

(21) Appl. No.: 10/079,988

(22) Filed: Feb. 20, 2002

(65) Prior Publication Data

US 2003/0159092 A1    Aug. 21, 2003

(51) Int. Cl.
G06F 11/08 (2006.01)
G06F 11/20 (2006.01)

(52) U.S. Cl. .............................................. 714/6; 714/7
(58) Field of Classification Search .................... 714/7, 714/710, 6
See application file for complete search history.

(56) References Cited

U.S. PATENT DOCUMENTS

| | | | | |
|---|---|---|---|---|
| 5,267,242 A * | 11/1993 | Lavallee et al. ................. | 714/7 |
| 5,357,509 A * | 10/1994 | Ohizumi .......................... | 714/7 |
| 5,502,728 A * | 3/1996 | Smith, III ...................... | 714/5 |
| 5,611,069 A * | 3/1997 | Matoba ....................... | 711/114 |
| 5,680,579 A * | 10/1997 | Young et al. ................ | 711/157 |
| 5,802,264 A * | 9/1998 | Chen et al. ..................... | 714/7 |
| 6,073,229 A * | 6/2000 | Crane et al. .................. | 712/33 |
| 6,154,853 A * | 11/2000 | Kedem .......................... | 714/6 |
| 6,223,252 B1 * | 4/2001 | Bandera et al. ............. | 711/114 |
| 6,223,301 B1 * | 4/2001 | Santeler et al. ................ | 714/6 |
| 6,226,757 B1 * | 5/2001 | Ware et al. ................. | 713/503 |
| 6,229,727 B1 * | 5/2001 | Doyle .......................... | 365/63 |
| 6,480,982 B1 * | 11/2002 | Chan et al. ................. | 714/764 |
| 6,598,174 B1 * | 7/2003 | Parks et al. .................... | 714/6 |
| 6,766,469 B1 * | 7/2004 | Larson et al. .................. | 714/7 |

\* cited by examiner

Primary Examiner—Stephen M. Baker

(57) ABSTRACT

A method of hot swapping memory is described. A memory system includes a plurality of memory banks such that a memory word is divided into the memory banks. The memory system is provided a spare memory bank. One of the memory banks is selected to be replaced. The memory system is configured to perform write operations associated with the selected memory bank to both the selected and spare memory banks. Atomic read and write operations are performed such that the content of the selected memory bank is copied to the spare memory bank. The memory system is subsequently configured to redirect operations to be performed on the selected memory bank to the spare memory bank such that the selected memory bank can be hot replaced.

20 Claims, 8 Drawing Sheets

HOT SWAPPING MEMORY METHOD AND SYSTEM

BACKGROUND OF THE INVENTION

1. Field of the Invention

The present invention generally relates to computer systems. More particularly, the present invention relates to memory systems.

2. Related Art

To improve reliability, availability, and serviceability, a variety of techniques have evolved to facilitate hot swapping memory in computer system such as personal computers and servers. This allows the memory defect (or failing memory) to be healed (or replaced) without taking the computer system down. Moreover, substantial error correction capability has been integrated into servers, allowing them to run with a faulty memory module without crashing.

Traditionally, hot swapping memory has been accomplished by mirroring. That is, a second copy of the memory content is provided in the main memory system. For every memory bank in the main memory system, there exists a mirror memory bank having the same content. Every write operation to the main memory writes two copies: one copy to the memory bank and one copy to the mirror memory bank. Each read comes from a single copy of the main memory system.

Many implementations read just one copy at a time—if the copy being read has an uncorrectable error (through whatever error correction code (ECC) scheme that is being used), the computer system will report an uncorrectable error and crash even though there probably is a correct copy of the read in the unread memory copy. This is an implementation optimization. The number of ECC corrections can be used as a trigger to switch which copy from main memory is being read at any particular time.

A hot swapping operation is accomplished by suspending all accesses to a memory bank (mirror or non-mirror), and then turning that memory bank off. Certain maintenance operations are done in order to make sure that both the memory bank and the mirror memory bank are consistent, especially around hot swap operations. This is strongly analogous to RAID 1 (redundant array of independent disks). It is easy to implement, but quite expensive since two full copies of the contents of the main memory are needed.

Another approach to hot swapping memory is based on RAID 3. In this approach, the main memory system has one copy plus some extra information to help recover if a small portion of the main memory fails. Typically, this is accomplished by dividing the main memory system into several memory banks, striping the data across the memory banks, and adding one extra memory bank that stores the parity (or some other function) of the data stored in the other memory banks. In this way, if the failing memory bank is known, the failing memory bank can be reconstructed from the remaining memory banks and the extra memory bank storing the parity information. This has the advantage that less memory capacity is needed than the mirroring approach, but at the cost of a more complex algorithm (e.g., to calculate parity) for managing the main memory system.

SUMMARY OF THE INVENTION

A method of hot swapping memory is described. A memory system includes a plurality of memory banks such that a memory word is divided into the memory banks. The memory system is provided a spare memory bank. One of the memory banks is selected to be replaced. The memory system is configured to perform write operations associated with the selected memory bank to both the selected memory bank and the spare memory bank. Moreover, atomic read and write operations are performed such that the content of the selected memory bank is copied to the spare memory bank. Furthermore, the memory system is subsequently configured to redirect operations to be performed on the selected memory bank to the spare memory bank such that the selected memory bank can be hot replaced.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

Hot Swapping Memory

Figure 1:
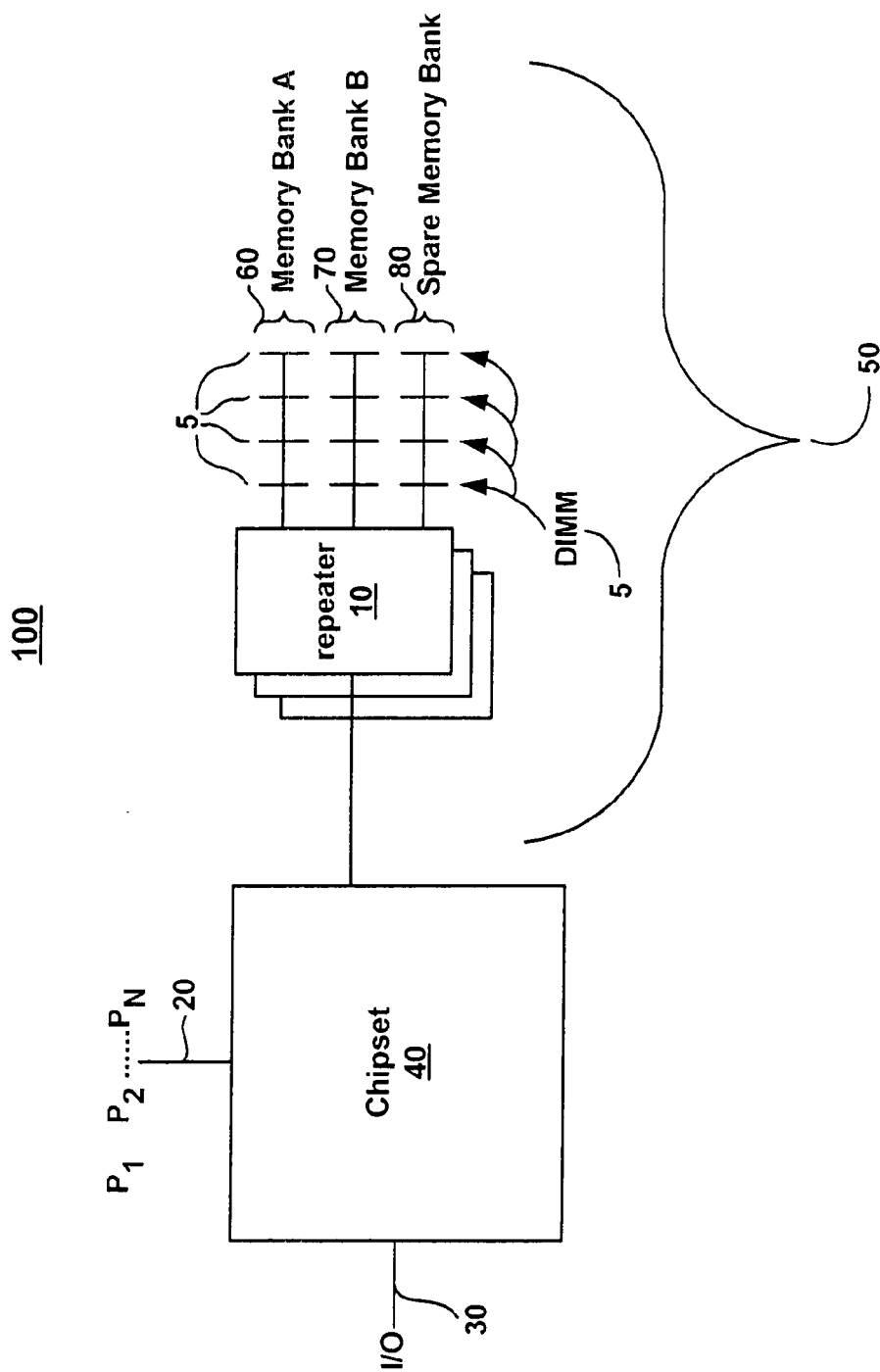
FIG. 1 illustrates a block diagram of a computer system in accordance with an embodiment of the present invention.

FIG. 1 illustrates a block diagram of a computer system 100 in accordance with an embodiment of the present invention. As illustrated in FIG. 1, the computer system 100 includes a chipset 40, one or more processors 20, one or more input/output data ports 30, and a memory system 50. In an embodiment, the memory system 50 is a main memory system 50. The chipset 40 interfaces the processor(s) 20 with the input/output data port(s) 30 and the main memory system 50. It should be understood that the computer system 100 can have other configurations.

In an embodiment, the main memory system 50 includes one or more repeaters 10 coupled to a plurality of memory banks 60 and 70 and coupled to a spare memory bank 80, whereas a memory word is divided into the memory banks 60 and 70 for storage. The repeater 10 can have separate circuit modules for the spare memory bank 80 and each memory bank 60 and 70 to facilitate write operations and read operations to the spare memory bank 80 and the memory banks 60 and 70. The spare memory bank 80 and each memory bank 60 and 70 include one or more memory modules 5, whereas each memory module 5 includes one or more memory chips. In an embodiment, the memory modules 5 are dual in-line memory modules (DIMMs). It should be understood that the memory module 5 can be any other type of memory module. It should be understood that the main memory system 50 can have more than two memory banks. Furthermore, it should be understood that the spare memory bank 80 and each memory bank 60 and 70 can have less than or more than four memory modules 5.

In an embodiment, the main memory system 50 implements any one of a variety of error correction code (ECC) schemes. In the main memory system 50 implementing an ECC scheme, a memory word includes a plurality of data bits and a plurality of ECC bits. Moreover, each type of ECC scheme has a different error correction capability. For example, some ECC schemes provide for automatic correction when a single bit is in error and provide for detection of two bits in error. Other ECC schemes provide multiple-bit correction. In particular, a chipkill ECC scheme enables the main memory system 50 to withstand a multi-bit failure within a memory chip of any one of the memory modules 5.

The computer system 100 supports a new hot swapping memory method, whereas the terms "hot swapping memory" refer to the capability to pull out or plug-in memory components (e.g., any of the memory banks 60 and 70 and the spare memory bank 80 of the computer system 100) while the computer system 100 is powered and still operating. The new hot swapping memory method builds on the RAID 3 concept by combining RAID 3 concepts with ECC schemes associated with main memory. Thus, the new hot swapping memory method relies on the ECC scheme for data accuracy but mimics RAID 3's ability to reconstruct data from a turned off memory bank by introducing a spare memory bank to be idle until the hot swapping is to be performed. Moreover, the new hot swapping memory method is less costly than the mirroring approached discussed above since one spare memory bank is needed rather than a mirror memory bank for each memory bank of the main memory system 50. Also, the new hot swapping memory method avoids the complex algorithm associated with RAID 3 on every write to memory (and reads while a memory bank is failed/turned off).

In particular, the new hot swapping memory method is accomplished with minimal support from the computer system's 100 hardware and without complicated or time consuming operations that substantially interfere with the performance of the computer system 100 during normal operation. The hot swapping memory can be implemented with hardware within the repeater 10. Alternatively, the hot swapping memory can be implemented with hardware within the chipset 40 or within any other location in the computer system 100.

In practice, the repeater 10 increases the memory capacity of the main memory system 50 and may have multiplexing capability. The repeater 10 may be implemented as a bit-sliced repeater that receives some bits from every memory bank. To support the new hot swapping memory method, the repeater 10 is configured to direct write operations for the main memory system 50 to a memory bank (e.g., memory bank A 60 or memory bank B 70), to a spare memory bank 80, or to both a memory bank (e.g., memory bank A 60 or memory bank B 70) and a spare memory bank 80. Moreover, the repeater 10 is configured to direct read operations for the main memory system 50 to a memory bank (e.g., memory bank A 60 or memory bank B 70) or to a spare memory bank 80.

Figure 2:
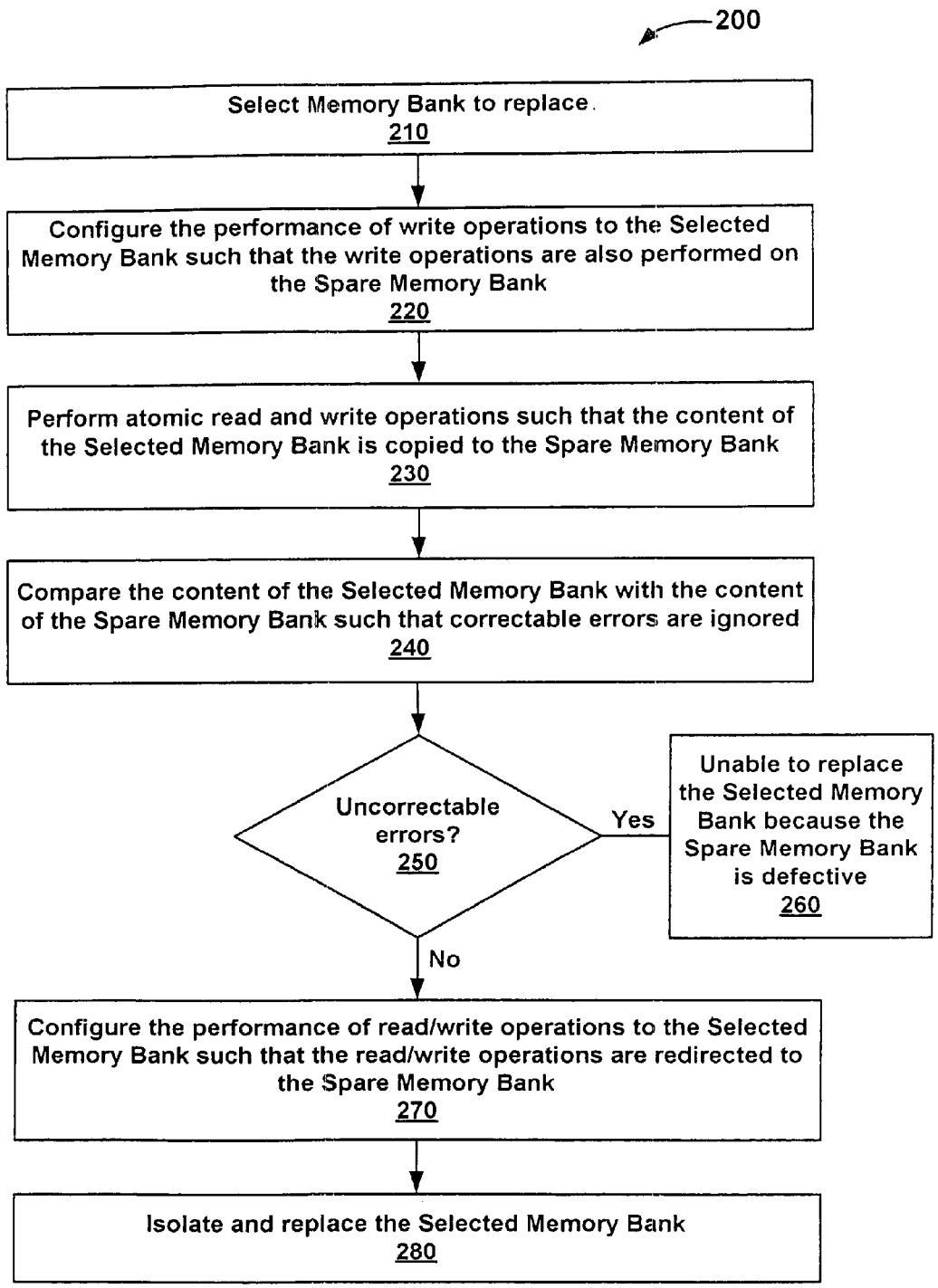
FIG. 2 illustrates a flow chart showing a method of hot swapping memory in accordance with an embodiment of the present invention.
Figure 3A:
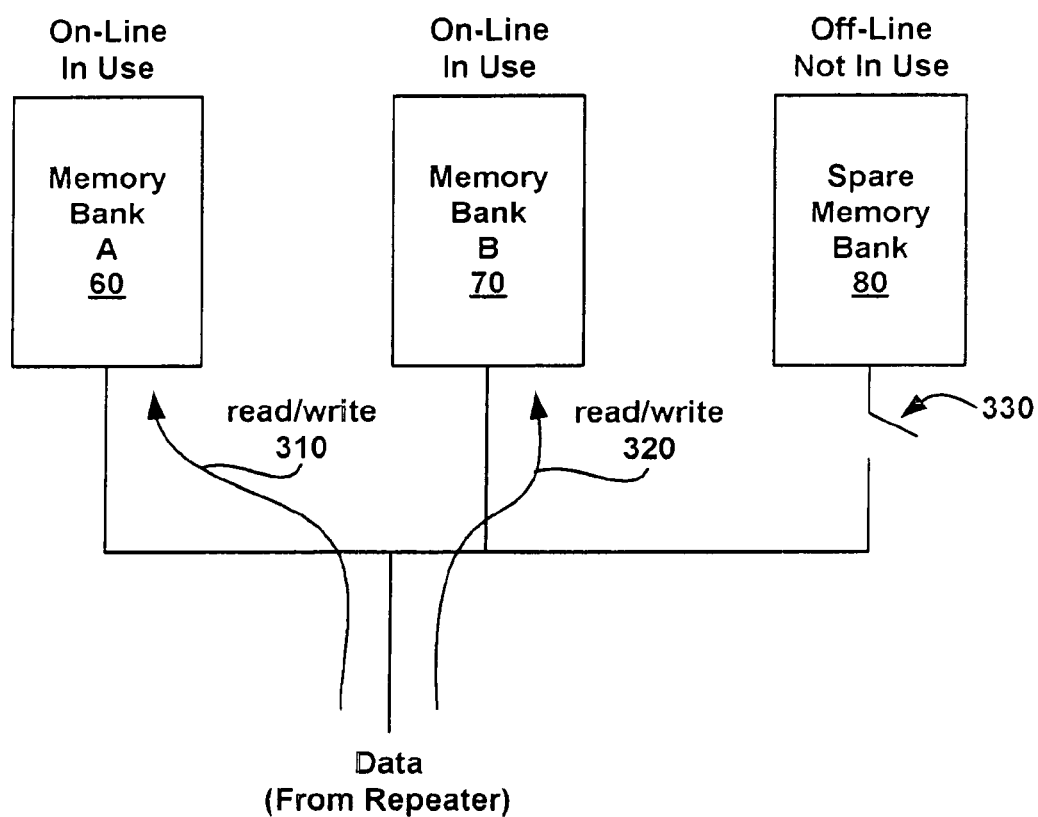
FIGS. 3A–3F illustrate memory data flow in accordance with an embodiment of the present invention.

FIG. 2 illustrates a flow chart showing a method 200 of hot swapping memory in accordance with an embodiment of the present invention. Reference is made to FIGS. 1 and 3A–3F. Initially, the memory bank A 60, the memory bank B 70, and the spare memory bank 80 of the computer system 100 are in the operational states illustrated in FIG. 3A. As depicted in FIG. 3A, the memory bank A 60 and the memory bank B 70 are on-line, in use, and populated with data received via the repeater 10. The arrow 310 indicates that read operations and write operations are being performed on the memory bank A 60 via the repeater 10. The arrow 320 indicates that read operations and write operations are being performed on the memory bank B 70 via the repeater 10. Moreover, the spare memory bank 80 is off-line via an isolation switch 330, is not being used for read operations or write operations, and is not populated with data. In fact, the spare memory bank 80 can be powered down to save power.

Figure 3B:
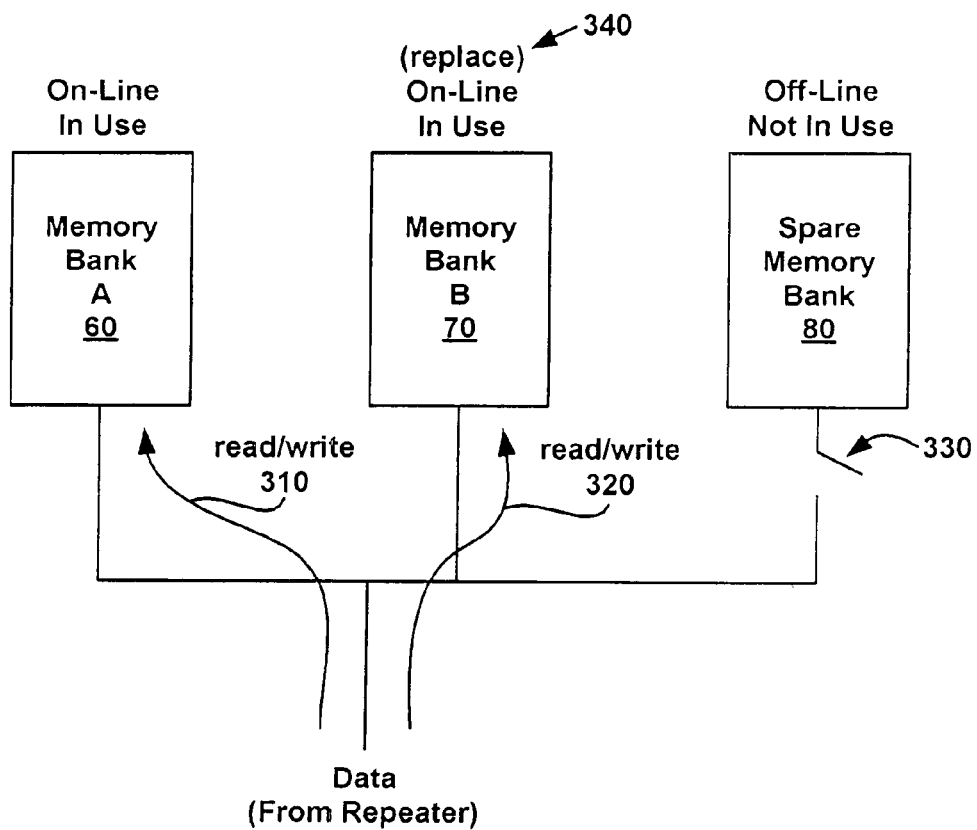

At Block 210 of FIG. 2, one of the memory banks (e.g., memory bank A 60 or memory bank B 70) is selected to be replaced. The selection can be made based on any number of factors. For example, the selected memory bank may need to be upgraded, repaired, maintained, expanded, etc. Additionally, by monitoring correctable memory errors during the computer system's 100 normal operation, the selected memory bank may have accumulated a number of correctable memory errors that has exceeded a particular threshold. As depicted in FIG. 3B, the memory bank B 70 has been selected to be replaced, whereas the arrow 340 indicates the selected memory bank.

Figure 3C:
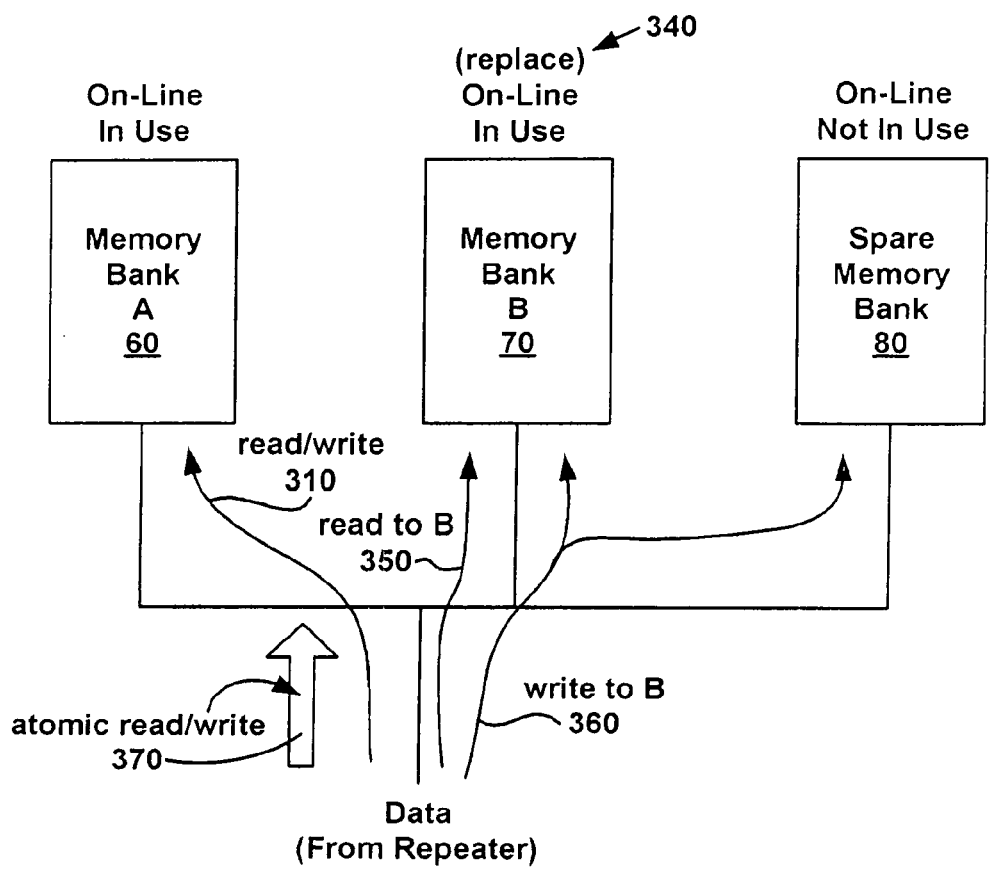

Furthermore, at Block 220 of FIG. 2, the main memory system 50 is configured to perform write operations associated with the selected memory bank 70 to both the selected memory bank 70 and the spare memory bank 80. In an embodiment, the repeater 10 directs write operations associated with the selected memory bank 70 to both the selected memory bank 70 and the spare memory bank 80. As depicted in FIG. 3C, the spare memory bank 80 is on-line but is not being used. Moreover, the arrow 350 indicates that read operations associated with the selected memory bank 70 are being performed on the selected memory bank 70. However, the arrow 360 indicates that write operations associated with the selected memory bank 70 are being performed on the selected memory bank 70 and the spare memory bank 80.

At Block 230 of FIG. 2, atomic read and write operations are performed such that the content of the selected memory bank 70 is copied to the spare memory bank 80. Normal memory accesses to the memory banks 60 and 70 continue during these atomic read and write operations. Any reduction in performance of the computer system 100 is dependent on the period of time in which these atomic read and write operations are performed. If these atomic read and write operations are performed in a short period of time, there may be a reduction in the performance of the computer system 100. If these atomic read and write operations are performed in a longer period of time, there may be just a minimal reduction in the performance of the computer system 100. In FIG. 3C, the arrow 370 indicates that atomic read and write operations are being performed. The chipset 40, low level software, the repeater 10, or any other component such as a memory controller can be configured to scrub (i.e., perform atomic read and write operations) the selected memory bank 70 into the spare memory bank 80. For example, in an atomic operation, the memory controller reads the memory word in the memory banks 60 and 70, and writes the memory word back into memory banks 60 and 70 and the spare memory bank 80. This is a common feature of memory controllers, and is intended to remove correctable soft errors from the main memory system 50.

Figure 3D:
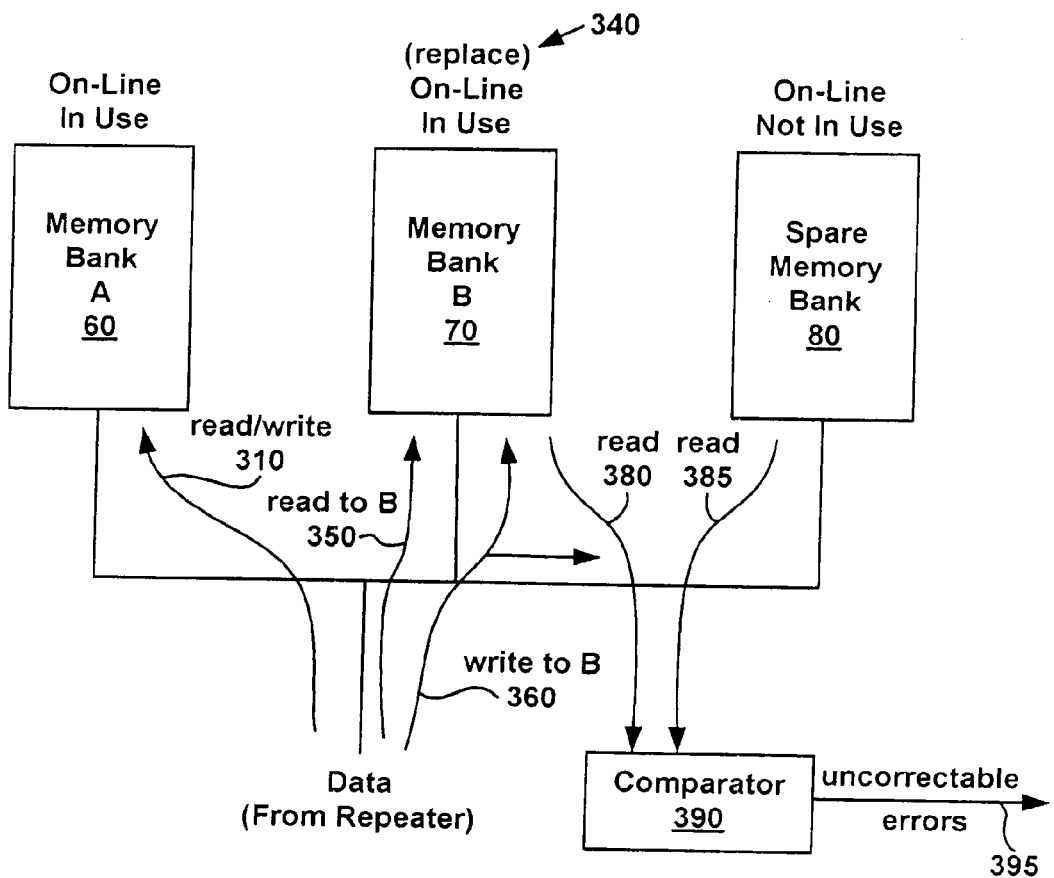

At Block 240 of FIG. 2, the content of the selected memory bank 70 is compared with the content of the spare memory bank 80 such that correctable errors are ignored. In an embodiment, the repeater 10 includes a comparator 390 (FIG. 3D). As described above, a memory word is divided into the memory banks 60 and 70 for storage. Further, the memory word may include a plurality of data bits and a plurality of ECC bits. Thus, memory bank 60 stores a first portion of the memory word while the memory bank 70 stores a second portion of the memory word. Any reference to "memory word" in "memory bank" (e.g., memory bank 60, memory bank 70, or spare memory bank 80) is intended to refer to either the first portion or the second portion of the memory word stored in the memory bank (e.g., memory bank 60, memory bank 70, or spare memory bank 80).

Continuing, a memory word of the selected memory bank 70 and a memory word of the spare memory bank 80 are read and compared until the entire content of the selected memory bank 70 is compared with the entire content of the spare memory bank 80.

There are several types of correctable errors, whereas correctable errors are bit errors that can be corrected by the ECC scheme implemented by the main memory system 50 (FIG. 1). Each type of correctable error situation is dependent on the type of ECC scheme implemented by the main memory system 50 (FIG. 1). For example, if the ECC scheme corrects single bit errors, the comparator 390 (FIG. 3D) will ignore single bit errors existing between the copy of the memory word stored in the selected memory bank 70 and the copy of the memory word stored in the spare memory bank 80. Thus, the spare memory bank 80 may not be error free, but it will be good enough to work. More importantly, any errors present in the selected memory bank 70 will not prevent the switch in memory banks (i.e., from the selected memory bank 70 to the spare memory bank 80) from occurring to facilitate hot replacing the selected memory bank 70. Similarly, if the ECC scheme is a chipkill ECC scheme or multibit ECC scheme, the comparator 390 (FIG. 3D) will ignore bit errors existing in particular bit sets between the copy of the memory word stored in the selected memory bank 70 and the copy of the memory word stored in the spare memory bank 80. In FIG. 3D, the arrow 380 indicates that a memory word is read from the selected memory bank 70 and sent to the comparator 390. Moreover, the arrow 385 indicates that a memory word is read from the spare memory bank 80 and sent to the comparator 390.

Continuing at Block 250 of FIG. 2, it is determined whether the comparator 390 (FIG. 3D) detected any uncorrectable errors. If the comparator 390 detected any uncorrectable errors, the method proceeds to Block 260. At Block 260, it is determined that the selected memory bank 70 cannot be hot replaced because the spare memory bank 80 is defective. Thus, the spare memory bank 80 must first be replaced. Then, the method 200 of FIG. 2 can be restarted. As depicted in FIG. 3D, the comparator 390 includes an indicator 395 for indicating the detection of uncorrectable errors. This is not enough to guarantee that the switch in memory banks (i.e., from the selected memory bank 70 to the spare memory bank 80 to facilitate hot replacing the selected memory bank 70) will be successful, but it will eliminate most of the failing cases (i.e., when the spare memory bank 80 is grossly defective).

Alternatively, the comparison operation (e.g., Blocks 240–260) can be omitted. However, performing the comparison operation (e.g., Blocks 240–260) increases the reliability of the switch in memory banks (i.e., from the selected memory bank 70 to the spare memory bank 80) to facilitate hot replacing the selected memory bank 70.

Figure 3E:
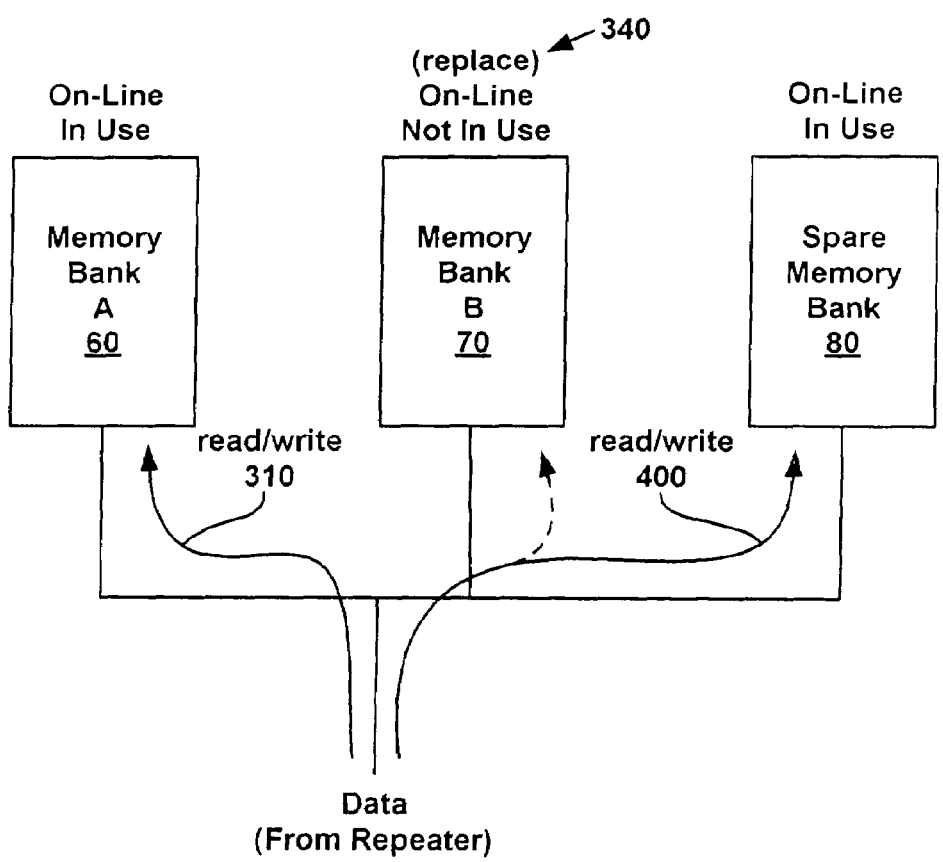

Otherwise, at Block 270 of FIG. 2, if the comparison operation is successful, the main memory system 50 is configured to perform read and write operations associated with the selected memory bank 70 on the spare memory bank 80 rather than the selected memory bank 70. In an embodiment, the repeater 10 redirects operations to be performed on the selected memory bank 70 to the spare memory bank 80 such that the selected memory bank 70 can be hot replaced. As depicted in FIG. 3E, the selected memory bank 70 is on-line but is no longer being used. Thus, the selected memory bank 70 can be placed in an off-line state. Moreover, the spare memory bank 80 is on-line and is being used for read operations and write operations. The arrow 400 indicates that the operations (read operations or write operations) to be performed on the selected memory bank 70 are being performed on the spare memory bank 80.

Figure 3F:
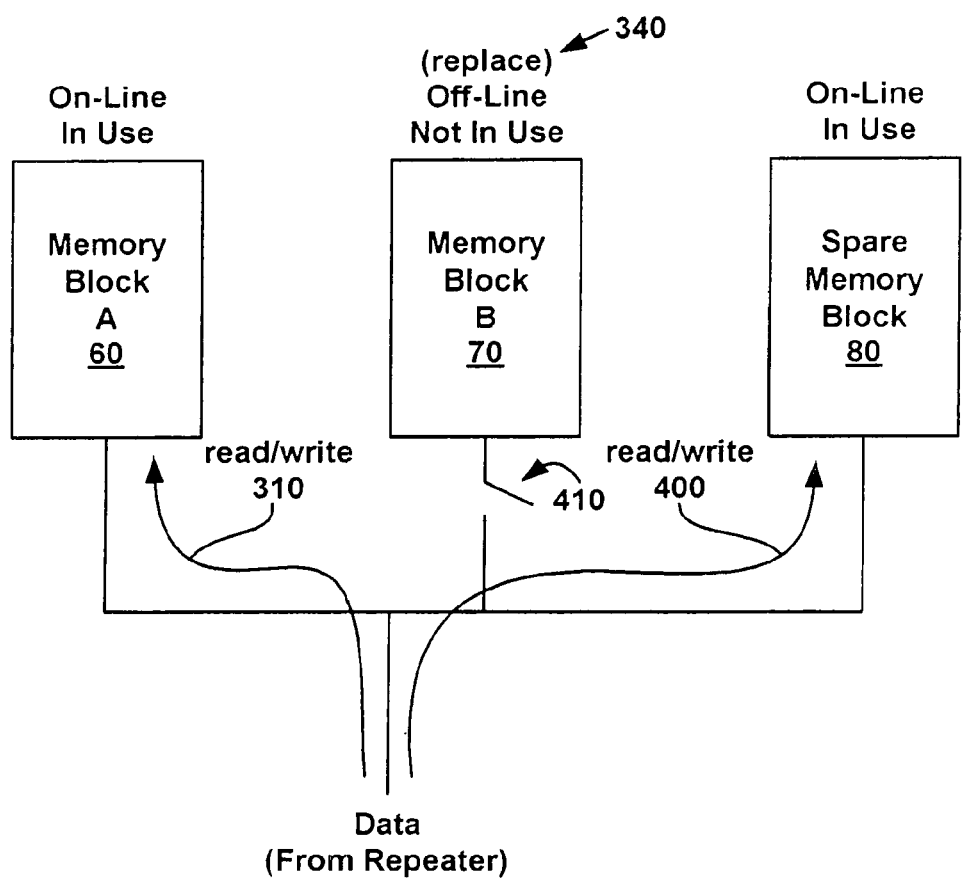

At Block 280 of FIG. 2, the selected memory bank 70 is isolated and replaced without powering down the computer system 100. As depicted in FIG. 3F, the selected memory bank 70 is off-line via the isolation switch 410 and is not being used. During the new hot swapping memory method of FIG. 2, there was no need to turn off the computer system 100 or to limit normal accesses to the main memory system 50 (FIG. 1). The new hot swapping memory method of FIG. 2 is dependent on the ECC scheme for error detection and correction but allows data to be copied between memory banks while normal memory accesses are occurring. In the new hot swapping memory method of FIG. 2, the selected memory bank 70 is the source memory bank while the spare memory bank 80 is the target memory bank.

In a dedicated spare memory bank embodiment, the selected memory bank 70 (or memory bank B 70) has to be replaced with a functional memory bank and the content of the spare memory bank 80 has to be copied to the functional memory bank using the new hot swapping memory method of FIG. 2, before the memory bank A 60 can be selected to be replaced using the new hot swapping memory method of FIG. 2.

For example, the selected memory bank 70 (which now is off-line and is not in use) is replaced with a functional memory bank. The spare memory bank 80 is selected such that the spare memory bank 80 is the source memory bank while the functional memory bank is the target memory bank. Then, the main memory system 50 is configured to perform write operations associated with the spare memory bank 80 to both the spare memory bank 80 and the functional memory bank. Moreover, atomic read and write operations are performed such that content of the spare memory bank 80 is copied to the functional memory bank. Furthermore, the content of the spare memory bank 80 is compared with the content of the functional memory bank such that correctable errors are ignored. Alternatively, the comparison operation can be omitted. However, performing the comparison operation increases the reliability of the switch in memory banks (i.e., from the spare memory bank 80 to the functional memory bank). If the comparison operation is successful, the main memory system 50 is configured to redirect operations to be performed on the spare memory bank 80 to the functional memory bank. Thus, the spare memory bank (which now is off-line and is not in use) 80 can be used in the new hot swapping memory method of FIG. 2 to hot replace any of the memory banks (e.g., memory bank A 60 or memory bank B 70).

In a non-dedicated spare memory bank embodiment, any unused memory bank of the memory banks can be used in place of the spare memory bank 80. Thus, it is not necessary to copy the content of the spare memory bank 80 to another memory bank using the new hot swapping memory method of FIG. 2, before another memory bank can be selected to be replaced using the new hot swapping memory method of FIG. 2. In case that the spare memory bank 80 is being used and is populated with data, any memory bank (e.g., memory bank A 60 or memory bank B 70) that is not populated with data and is not being used can be utilized in place of the spare memory bank for the new hot swapping memory method of FIG. 2.

For instance, the selected memory bank 70 (which now is off-line and is not in use) is replaced with a functional memory bank. Then, a particular memory bank from the memory bank A 60 and the spare memory bank 80 is selected to be hot replaced such that the particular memory bank is the source memory bank while the functional memory bank is the target memory bank. The main memory system 50 is configured to perform write operations associated with the particular memory bank to both the particular memory bank and the functional memory bank. Then, atomic read and write operations are performed such that the content of the particular memory bank is copied to the functional memory bank. The content of the particular memory bank is compared with the content of the functional memory bank such that correctable errors are ignored. Alternatively, the comparison operation can be omitted. However, performing the comparison operation increases the reliability of the switch in memory banks to facilitate hot replacing a memory bank. If the comparison operation is successful, the main memory system 50 is configured to redirect operations to be performed on the particular memory bank to the functional memory bank.

In order to facilitate further hot replacing of other memory banks, the particular memory bank (which now is off-line and is not in use) is replaced with a second functional memory bank. In a similar manner as described above, a second particular memory bank from the memory banks and the spare memory bank 80 is selected to be replaced. Moreover, the new hot swapping memory method of FIG. 2 can be performed using the second functional memory bank as the target memory bank and using the second particular memory bank as the source memory bank. This process of hot swapping memory may further be repeated to replace every memory bank in turn.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of hot swapping memory, comprising:
   a) providing a spare memory bank in a memory system, wherein said memory system includes a plurality of memory banks such that a memory word is divided into said memory banks;
   b) selecting one of said memory banks to replace;
   c) configuring said memory system to perform write operations associated with said selected memory bank to both said selected memory bank and said spare memory bank before initiating copying of said selected memory bank to said spare memory bank;
   d) performing atomic read and write operations to copy content of said selected memory bank to said spare memory bank; and
   e) configuring said memory system to redirect operations to be performed on said selected memory bank to said spare memory bank such that said selected memory bank can be hot replaced.

2. A method as recited in claim 1 further comprising:
   f) replacing said selected memory bank with a functional memory bank;
   g) configuring said memory system to perform write operations associated with said spare memory bank to both said spare memory bank and said functional memory bank;
   h) performing atomic read and write operations such that content of said spare memory bank is copied to said functional memory bank; and
   i) configuring said memory system to redirect operations to be performed on said spare memory bank to said functional memory bank.

3. A method as recited in claim 1 further comprising:
   f) replacing said selected memory bank with a functional memory bank;
   g) selecting a particular memory bank of said memory banks and said spare memory bank to replace;
   h) configuring said memory system to perform write operations associated with said particular memory bank to both said particular memory bank and said functional memory bank;
   i) performing atomic read and write operations such that content of said particular memory bank is copied to said functional memory bank; and
   j) configuring said memory system to redirect operations to be performed on said particular memory bank to said functional memory bank.

4. A method as recited in claim 3 further comprising:
   k) replacing said particular memory bank with a second functional memory bank;
   l) selecting a second particular memory bank of said memory banks, said functional memory bank, and said spare memory bank to replace; and
   m) repeating said steps h) to j) using said second functional memory bank in place of said functional memory bank and using said second particular memory bank in place of said particular memory bank.

5. A method as recited in claim 1 further comprising:
   comparing content of said selected memory bank with content of said spare memory bank such that correctable errors are ignored; and
   if said comparing is successful, performing said step e).

6. A method as recited in claim 5 wherein said comparing is dependent on an error correction code (ECC) scheme of said memory system.

7. A method as recited in claim 1 wherein said memory system includes a repeater.

8. A circuit comprising a repeater coupled to a plurality of memory banks such that a memory word is divided into said memory banks and coupled to a spare memory bank, wherein said repeater directs write operations to be performed on a selected memory bank to both said selected memory bank and said spare memory bank before initiating copying of said selected memory bank to said spare memory bank, wherein after atomic read and write operations are performed to copy content of said selected memory bank to said spare memory bank, said repeater redirects operations to be performed on said selected memory bank to said spare memory bank such that said selected memory bank can be hot replaced.

9. A circuit as recited in claim 8 wherein an unused memory bank of said memory banks is used in place of said spare memory bank.

10. A circuit as recited in claim 8 wherein said selected memory bank is replaced with a functional memory bank, wherein said repeater directs write operations to be performed on said spare memory bank to both said spare memory bank and said functional memory bank, wherein after atomic read and write operations are performed such that content of said spare memory bank is copied to said functional memory bank, said repeater redirects operations to be performed on said spare memory bank to said functional memory bank.

11. A circuit as recited in claim 8 wherein said repeater compares content of said selected memory bank with content of said spare memory bank such that correctable errors are ignored, and wherein said comparison operation is dependent on an error correction code (ECC) scheme associated with said plurality of memory banks and said spare memory bank.

12. A memory system comprising:
a plurality of memory banks such that a memory word is divided into said memory banks; and
a spare memory bank, wherein write operations associated with a selected memory bank are directed to both said selected memory bank and said spare memory bank before initiating copying of said selected memory bank to said spare memory bank, wherein atomic read and write operations are performed to copy content of said selected memory bank to said spare memory bank, and wherein operations to be performed on said selected memory bank are redirected to said spare memory bank such that said selected memory bank can be hot replaced.

13. A memory system as recited in claim 12 wherein an unused memory bank of said memory banks is used in place of said spare memory bank.

14. A memory system as recited in claim 12 wherein said selected memory bank is replaced with a functional memory bank, wherein write operations associated with said spare memory bank are directed to both said spare memory bank and said functional memory bank, wherein atomic read and write operations are performed such that content of said spare memory bank is copied to said functional memory bank, and wherein operations to be performed on said spare memory bank are redirected to said functional memory bank.

15. A memory system as recited in claim 12 wherein content of said selected memory bank is compared with content of said spare memory bank such that correctable errors are ignored, and wherein said comparison operation is dependent on an error correction code (ECC) scheme associated with said plurality of memory banks and said spare memory bank.

16. A memory system as recited in claim 12 further comprising a repeater coupled to said memory banks and to said spare memory bank.

17. A computer system comprising:
a memory system including a plurality of memory banks such that a memory word is divided into said memory banks, a spare memory bank, and a repeater coupled to said memory banks and said spare memory bank, wherein write operations associated with a selected memory bank are directed to both said selected memory bank and said spare memory bank before initiating copying of said selected memory bank to said spare memory bank, wherein atomic read and write operations are performed to copy content of said selected memory bank to said spare memory bank, and wherein operations to be performed on said selected memory bank are redirected to said spare memory bank such that said selected memory bank can be hot replaced.

18. A computer system as recited in claim 17 wherein an unused memory bank of said memory banks is used in place of said spare memory bank.

19. A computer system as recited in claim 17 wherein said selected memory bank is replaced with a functional memory bank, wherein write operations associated with said spare memory bank are directed to both said spare memory bank and said functional memory bank, wherein atomic read and write operations are performed such that content of said spare memory bank is copied to said functional memory bank, and wherein operations to be performed on said spare memory bank are redirected to said functional memory bank.

20. A computer system as recited in claim 17 wherein content of said selected memory bank is compared with content of said spare memory bank such that correctable errors are ignored, and wherein said comparison operation is dependent on an error correction code (ECC) scheme associated with said plurality of memory banks and said spare memory bank.

* * * * *